United States Patent [19]

Taylor, Jr.

[11] Patent Number: 4,489,154
[45] Date of Patent: Dec. 18, 1984

[54] PROCESS FOR PREPARING A SURPRINT PROOF

[75] Inventor: Harvey W. Taylor, Jr., Sayre, Pa.

[73] Assignee: E. I. Du Pont de Nemours and Company, Wilmington, Del.

[21] Appl. No.: 564,381

[22] Filed: Dec. 22, 1983

[51] Int. Cl.³ .......... G03C 1/68; G03C 7/00; G03F 3/00
[52] U.S. Cl. ..................... 430/253; 430/257
[58] Field of Search ............... 430/253, 257

[56] References Cited

U.S. PATENT DOCUMENTS

| | | | |
|---|---|---|---|
| 3,721,557 | 3/1973 | Inoue | 430/257 |
| 3,785,817 | 1/1974 | Kuchta | 430/253 |
| 4,282,308 | 8/1981 | Cohen | 430/271 |
| 4,316,951 | 2/1982 | Cohen et al. | 430/253 |

Primary Examiner—Richard L. Schilling

[57] ABSTRACT

Process for preparing a surprint proof using an imagewise exposed peel apart photosensitive element comprising a strippable cover sheet, a photoadherent layer containing a colorant, a tacky nonphotosensitive contiguous layer, and a support wherein after peeling apart, if exposed through a separation negative, a positive colored photoadherent image on the cover sheet is adhered to a substrate, or, if exposed through a separation positive, a positive colored photoadherent image on the supported contiguous layer is adhered to a substrate. By repeating the process different colored layers can be built upon the substrate to form the surprint proof.

15 Claims, 6 Drawing Figures

PROCESS FOR PREPARING A SURPRINT PROOF

DESCRIPTION

1. Technical Field

This invention relates to a process for preparing a surprint proof. More particularly this invention relates to a process for preparing a surprint proof using a peel apart photosensitive element comprising a strippable cover sheet, a photoadherent layer containing a colorant, a tacky nonphotosensitive contiguous layer, and a support.

2. Background Art

Many photosensitive elements are known that are useful for the preparation of color proofs. After imagewise exposure the photosensitive elements may be developed by solvent or aqueous washout of soluble image areas, toning tacky image areas with a colorant, or a combination of washout and toning. In Cohen and Fan U.S. Pat. No. 4,282,308 there is described a photopolymerizable element which is capable of producing reverse colored images by a dry process without the need for toning with a colorant. The element comprises, in order from top to bottom, a strippable cover sheet, a photoadherent layer containing a colorant, a tacky nonphotosensitive contiguous layer, and a support. After imagewise exposure to actinic radiation through the cover sheet, the element can be peeled apart by peeling the cover sheet with the exposed image areas adherent thereto thus forming a negative image. The peel force required to remove the cover sheet with the exposed photoadherent layer thereon from the contiguous layer is at least four times the peel force required to remove the cover sheet from an unexposed photoadherent layer. When the exposure is through a negative image, e.g., negative separation transparency, and the exposed element is peeled a positive image is obtained on the cover sheet. When the exposure is through a positive image, e.g., positive separation transparency, and the element is peeled a positive image is obtained on the supported tacky contiguous layer. These positive images are generally not used and are therefore discarded.

It is desirable to provide a method for using the colored positive images formed from imagewise exposure and peeling apart the multilayer photosensitive elements described above. It is particularly desirable to form a surprint proof which does not require the use of colored toners for color production.

BRIEF DESCRIPTION OF THE DRAWINGS

In the accompany Figures forming part of this disclosure

DISCLOSURE OF INVENTION

Figure 1A:
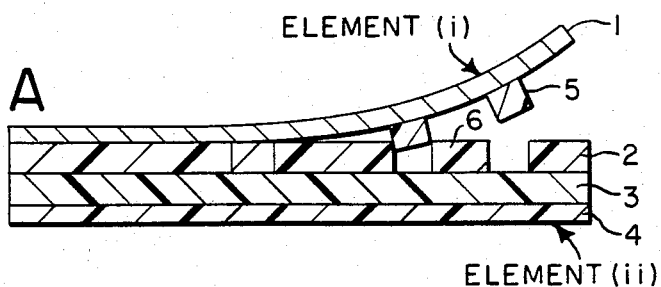
FIG. 1A illustrates a photosensitive element comprising a strippable cover sheet (1), a colored photoadherent layer (2), a contiguous layer (3), and a support (4). The exposed colored areas (5) of the photoadherent layer (2) adhere to and are removed with the strippable cover sheet (1) after imagewise exposure of the element to actinic radiation and peeling apart. The exposed colored areas (5) present on cover sheet (1) is designated element (i). Unexposed colored areas (6) of the photoadherent layer (2) remaining on the supported contiguous layer (3) after imagewise exposure and peeling apart is designated element (ii).

In accordance with this invention there is provided a process for preparing a surprint proof which comprises (a) exposing through an image bearing transparency a peel-apart photosensitive element comprising in order from top to bottom, (1) a strippable cover sheet comprised of a polymeric film which is transparent to actinic radiation (2) a photoadherent layer containing a colorant and comprising a photohardenable material with ethylenically unsaturated or benzophenone type groups, (3) a nonphotosensitive organic contiguous layer, and (4) a sheet support, wherein, after exposure to actinic radiation, the peel force required to remove the cover sheet (1) with the exposed photoadherent layer (2) thereon from the contiguous layer (3) is at least four times the peel force required to remove the cover sheet (1) from an unexposed photoadherent layer (2):

(b) peeling apart the exposed photosensitive element to form two elements: (i) cover sheet bearing on its surface colored exposed image areas, and (ii) sheet support bearing the contiguous layer having on its surface complementary colored unexposed image areas:

(c) adhering one of said elements (i) or (ii) to the surface of a substrate, the degree of adhesion to the photoadherent layer being greater than the adhesion of the photoadherent layer to the contiguous layer or the cover sheet.

(d) separating either the cover sheet of element (i), or the sheet support and contiguous layer of element (ii):

(e) repeating steps (a) to (c) at least once using a new peel-apart photosensitive element which is adhered to said preceding element by a layer of adhesive.

The process for preparing a surprint proof as described and claimed herein in a dry process. By "dry process" is meant a process in which liquids need not be used. The photoadherent layer, which is the sole photosensitive layer of the element, is one whose adhesive relationship between the cover sheet and the contiguous layer is altered by exposure to actinic radiation, so that after exposure the exposed areas of the photoadherent layer adhere more strongly to the cover sheet than to the contiguous layer and are removed with the cover sheet while the unexposed areas of the photoadherent layer adhere more strongly to the tacky contiguous layer than to the cover sheet.

Adhesive and cohesive force relationships of the layers are useful in characterizing the elements of this invention wherein $A_1$ represents the adhesive force between the cover sheet (1) and the unexposed photoadherent layer (2): $A_2$ represents the adhesive force between the unexposed photoadherent layer (2) and the tacky contiguous layer (3); and C represents the cohesive value of the unexposed photoadherent layer (2). Thus in the unexposed state $A_1$ is the lowest value, and the element will peel at the cover sheet/photoadherent layer interface. The force relationship may be represented by:

$$C > A_1 << A_2$$

It has been found that upon imagewise exposure of the element, dramatic changes occur in adhesive and cohesive values. $A_1^*$ represents the adhesive force between exposed areas (5) of the photoadherent layer (2) and the cover sheet (1); $A_2^*$ represents the adhesive force between exposed areas (5) and the tacky contiguous layer (3); and $C^*$ represents the cohesive value of the photoadherent layer in the exposed areas (5). Thus in the exposed state $A_2^*$ is the lowest value while the cohesive value C of the unexposed areas also must be sufficiently low to allow a clean break in the photoadherent layer (2) at the interface between the exposed areas (5) and unexposed areas (6) to allow exposed areas (5) to be completely removed when the cover sheet is peeled away. The resulting force relationship may be represented by:

$$C < A_1^* >> A_2^* < C^*$$

The combined effect of these cohesive and adhesive values is measured by the force required to peel or remove the cover sheet at an angle of 180° from the surface of an element as a function of the amount of actinic exposure and the cover sheet removal rate. Although peel force increases with increasing cover sheet removal rate, this increase is relatively small in the range of above 600 inches/minute (524 cm/minute). Typically for elements of this invention peel force in the exposed areas, $A_2^*$, is dramatically higher than in the unexposed areas, $A_1$, i.e., at least four times higher and preferably at least an order of magnitude difference. Surprisingly, these elements also show greatly improved image fidelity and tonal range. Thus in the unexposed state, the peel force to remove the cover sheet is very low and separation occurs at the interface between the cover sheet and the photoadherent layer and is equivalent to adhesive force $A_1$. For this invention adhesive forces $A_1$, typically are below 20 g/inch (~7.9 g/cm) and are generally between 5 and 10 g/inch (~1.97 and ~3.94 g/cm). Upon exposure, following the induction period, photopolymerization or photoadhesion starts and peel force values increase rapidly with continued exposure. At intermediate exposures where polymerization of the photoadherent layer is insufficient the separation occurs at intermediate points in the photoadherent layer and does not give a good image. At the correct exposure level, however, the locus of failure shifts to the interface between the exposed photoadherent layer and the contiguous layer. The peel force at this point reaches a plateau and remains substantially constant over an extensive exposure range. Peel forces in the plateau regions are equivalent to adhesive forces $A_2^*$. For this invention adhesive forces $A_2^*$ are typically above 80 g/inch (~31.5 g/cm), and preferably are between 100 and 700 g/inch (39.37 and 275.59 g/cm). Thus the ratio of adhesive forces for exposure to unexposed elements, i.e., ($A_2^*/A_1$) is at least 4, and preferably between 10 and 100 or above. By comparison, peel forces reported from previous peel apart systems such as disclosed in the publication "Image Formation by Photoadhesion" by Woodruff et al., Photographic Science and Engineering, Vol. 11, No. 2, pp. 93–97, March-April 1967, U.S. Pat. Nos. 3,353,955, 3,607,264 and 3,754,920 are typically below about 20 g/inch (~7.9 g/cm) with ratios of peel forces between exposed and unexposed layers being about 2 or less.

The strippable cover sheet of the element of the invention must be strippable (i.e., removable by peeling it apart) from the rest of the element, carrying with it only the exposed areas of the photoadherent layer. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polyimide, polystyrene, or polyolefin, e.g., polyethylene or polypropylene films may also be employed. In order to make the exposed areas of the photoadherent layer adhere better to the cover sheet, the cover sheet's surface may be modified; for example, the topography may be altered and the polarity increased by a surface treatment such as electrostatic discharge or flame treatment. In the case of a polyethylene terephthalate film having a thickness of 0.0005 inch (~0.013 mm), an electrostatic discharge of at least 0.025 coulomb/ft$^2$ (0.272 coulomb/m$^2$) and preferably about 0.07 coulomb/ft$^2$ 0.762 coulomb/m$^2$) is suitable. However, increased treatments may be used. Flame treatment of the film also will provide good photoadhesion. An air-propane flame may be used.

While the thickness of the cover sheet may be varied over a wide range, films having a thickness of 0.001 inch (0.025 mm) or less are particularly preferred. Thin cover sheets produce halftone dots of good roundness with sharp edges. In addition, a tonal range of 2–98% dot resolution (using a halftone screen with 150 lines/inch) and a rapid rate of cover sheet strippability, e.g., up to 9,000 inches/minute (22,860 cm/minute) or higher, is obtainable with thin cover films. By "tonal range" is meant the range of sizes of resolvable halftone dots as a percentage of a maximum dot size. In general, a rapid rate of cover sheet stripping produces better image quality. The cover sheet should be thick enough so that electrostatic discharge or flame treatment will not injure it and so that it may be stripped without tearing. The cover sheet may additionally comprise auxiliary treatments or layers to improve adhesion, strength, and other properties.

After imagewise exposure of the peel apart photosensitive element to actinic radiation, the exposed areas of the photoadherent layer adhere more strongly to the cover sheet than to the contiguous layer in the exposed areas and more strongly to the contiguous layer than to the cover sheet in the unexposed areas. Photohardenable materials are used for the photoadherent layer. Such materials are usually comprised of a material with ethylenically unsaturated or benzophenone-type groups in which an increase in molecular weight and, consequently, an increase in adherence to the cover sheet are caused by exposure to actinic radiation. The well-known photohardenable materials which are comprised of an ethylenically unsaturated material which is photopolymerizable, photocrosslinkable, photodimerizable or combinations thereof are preferred. Such materials are described, for example, in Chu et al., U.S. Pat. No. 3,649,268. Particularly preferred are photopolymerizable compositions comprised of a macromolecular organic polymer binder and an addition polymerizable ethylenically unsaturated monomer. The binder can be a polar material such as an acidic polymer containing at least 1.5 mole percent free acid groups to impart polarity to the polymer, or a nonpolar material, e.g., materials as described in U.S. Pat. Nos. 3,060,023, 3,649,268 and 3,984,244. The monomer has at least one and preferably two or more terminal ethylenically unsaturated groups capable of free-radical initiated, chain propagated addition polymerization, said monomer preferably having some degree of polarity and being compatible with the binder and with the polar surface of the cover sheet, but substantially nondiffusible in the contiguous tonable layer. The photopolymerizable composition will also contain a free-radical generating addition polymerization photoinitiating system (i.e., at least one organic photoinitiator compound) activatable by actinic radiation, e.g., ultraviolet and visible radiation. Among acidic binders which have been found useful, there may be mentioned co(methyl methacrylate/methacrylic acid) and monoethyl ester of poly(methyl vinyl ether/maleic anhydride), each of which may be copolymerized in various proportions. Many other polar polymers and copolymers known in the art will be found useful as a binder in the photopolymerizable layer. Among the ethylenically unsaturated monomers which have been found useful are those disclosed in Plambeck, U.S. Pat. No. 2,760,863; Cohen and Schoenthaler, U.S. Pat. No. 3,380,831 and Chambers and Woodward U.S. Pat. No. 3,573,918. There may be mentioned as examples dipentaerythritol acrylate (50% tetra and 50% penta), pentaerythritol triacrylate and tetraacrylate, polypropylene glycol (50) ether of pentaerythritol tetraacrylate, polyethylene glycol (200) dimethacrylate, dipentaerythritol monohydroxy pentaacrylate, pentaerythritol triacrylate $\beta$-hydroxyethyl ether, polypropylene glycol (550) ether of pentaerythritol tetramethacrylate, pentaerythritol tetramethacrylate, polypropylene glycol (425) dimethacrylate, trimethylolpropane trimethacrylate, and polypropylene glycol (340) ether of trimethylol propane triacrylate. Also useful are epoxy monomers containing ethylene unsaturation, e.g., monomers of the type disclosed in U.S. Pat. No. 3,661,576 and British Pat. No. 1,006,587. The binder may be varied widely in its ratio with the monomer but in general it should be in the range of 3:1 to 1:3. The monomer should be compatible with, and may be a solvent for, and/or have a plasticizing action on the binder. The choice and proportions of monomer and binder are made in accordance with the requirements of selective photoadherence and hardness. In order to provide a suitable hardness, the monomer concentration is normally kept low so that the layer coated from the composition will be sufficiently hard and nontacky.

The free-radical generating addition polymerization initiating systems activatable by actinic radiation may be, for example, any of those disclosed in Notley, U.S. Pat. No. 2,951,752; Chang and Fan, U.S. Pat. No. 3,549,367; Fan, U.S. Pat. No. 3,558,322; and Chang, U.S. Pat. No. 3,926,643. Other particularly useful initiating systems are disclosed in Cescon et al., U.S. Pat. No. 3,615,454; Grubb, U.S. Pat. No. 3,647,467; Baum et al., U.S. Pat. No. 3,652,275; Chang, U.S. Pat. No. 3,661,558; and Strilko, U.S. Pat. No. 3,697,280. The photopolymerizable layer may also contain other ingredients including plasticizers, antihalation agents and optical brightening agents. By the incorporation of optical brightening agents in the photoadherent layer, the image record is produced free from distortion due to halation effects and free from discoloration due to element components. Suitable optical brighteners can be found in Keller, U.S. Pat. No. 2,784,183 and Gurney, U.S. Pat. No. 3,644,394. Specific brightener compounds which are particularly useful in the photopolymerizable layers of this invention are 2-(stilbyl-4")-(naphtho-1',2',4,5)-1,2,3-triazol-2"-sulfonic acid phenyl ester and 7-(4'-chloro-6'-diethyl amino-1',-3,5'-triazine-4'-yl) amino-3-phenyl-coumarin. Sensitizers can also be present in the photoadherent layer, e.g., 4,4'-diethylaminobenzophenone 7-diethylamino-4-methyl coumarin, etc.

The photoadherent layer is colored either yellow, magenta, cyan or black. Many colorants (pigments or dyes) can be used provided that they are compatible with the other ingredients that are present in the photoadherent layer. Examples of suitable pigments include:

yellow: Cromophtal® Yellow 3G (C.I. No. Pigment Yellow 93), Hostaperm® Yellow 3G (C.I. No. Pigment Yellow 154);

magenta: Monastral® Violet R (C.I. No. Pigment Violet 19), 2,9-Dimethylquinacridone (C.I. No. Pigment Red 122), Indofast® Brilliant Scarlet R6300 (C.I. No. Pigment Red 123;

cyan: Monastral® Blue G (C.I. No. Pigment Blue 15), Monastral® Blue (BT 383D) (C.I. No. Pigment Blue 15), Monastral® Blue G (BT 284D) (C.I. No. Pigment Blue 15), Monastral® Green GT (751D) (C.I. No. Pigment Green 7);

black: Raven®450 (C.I. No. Pigment Black 7), Raven®1035 (C.I. No. Pigment Black 7), Elftex®8 (C.I. No. Pigment Black 7), Elftex®12 (C.I. No. Pigment Black 7), etc.

While the coating weight of the photoadherent composition may be varied, it has been found that a preferred range from 20–100 mg/dm$^2$ (providing a dry layer thickness of about 0.00006–0.00033 inch (0.0015–0.0084 mm)) will give good image quality and tonable range.

The contiguous layer may be chosen from a great number of materials. The contiguous layer is a nonphotosensitive tacky or slightly soft deformable organic material. For an element with good aging stability, suitable materials for the contiguous layer should restrain monomer diffusion from the photoadherent layer into the contiguous layer. Such materials may be selected from resins, polymers in which monomer of the photoadherent layer is substantially nondiffusible, adhesive compositions, etc. Particularly preferred materials are elastomeric polymers and mixtures thereof having a second order transition temperature of −10° C. or lower which are inherently tacky or will accept tackifying agents and which are nonmigratory into said photoadherent layer and which will impart tackiness to the layer. Rubber type polymers, both natural and synthetic may be used, e.g., isobutylene, Thiokol A, nitrile rubbers, butyl rubber, chlorinated rubbers, polymers of butadiene, isoprene, poly(vinylisobutylether), and random, teleblock and block copolymers of butadiene or isoprene copolymerized with styrene, and neoprene, silicone elastomers, etc., in various proportions. With these materials, a stable adhesion balance between the photoadherent layer and a support for the contiguous layer, in a preferred element, may be achieved for elements useful in making color proofs by the surprint method.

Any suitable solvent may be used to coat the contiguous layer as long as it does not cause migration of components of the layer into the photoadherent layer when the two layers are coated simultaneously. The coating weight of the contiguous layer may be varied over a wide range, but generally a coating weight of about 40 mg/dm$^2$ (generally providing a dry thickness of about 0.00015 inch (0.0038 mm)) will be satisfactory. The contiguous layer may also be coated as a dispersion, e.g., an aqueous dispersion with satisfactory results.

As illustrated in the drawings, the element has a support (4) for the contiguous layer (3). The support (4) may be any suitable film which has the necessary characteristics for the proper adhesion to layer (3), e.g., photographic grade polyethylene terephthalate such as disclosed in Alles U.S. Pat. No. 2,779,684.

The manufacture of the above-described elements may be accomplished in several different ways. For example, the photoadherent layer (2) may be coated on the cover sheet (1) and then after drying, contiguous layer (3) is coated from a solvent solution and then after drying, a support (4) may be laminated to the surface of layer (3). The solvent for the contiguous layer (3) should not have any solubilizing or deleterious effect on photoadherent layer (2). Another method is to coat the photoadherent layer (2) onto the cover sheet (1) and coat contiguous layer (3) onto a support (4) and then after drying the coated layers, laminating the surfaces of layers (2) and (3) under pressure at room temperature or elevated temperature. Layers (2) and (3) may also be coated simultaneously in order on support (1) and then a support (4) may be laminated to the outer surface of layer (3). All of these methods are known to those skilled in the art of coating multilayer films.

Figure 1B:
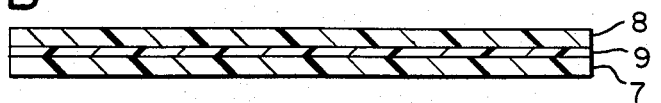
FIG. 1B illustrates a substrate (7) to which is laminated an element comprising a removable support (8), e.g., a polyethylene terephthalate film coated with a release layer, and an adhesive layer (9).
Figure 1C:
FIG. 1C illustrates that adhesive layer (9) is retained on substrate (7) after the removable support (8) has been removed.
Figure 1D:
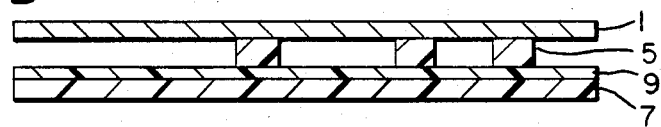
FIG. 1D illustrates element (i) of FIG. 1 being adhered to adhesive layer (9) on substrate (7).
Figure 1E:
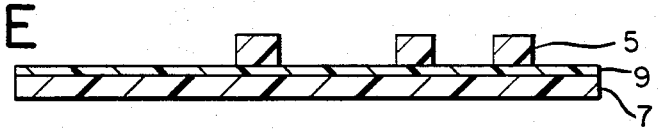
FIG. 1E illustrates first colored area (5), e.g., yellow, of a surprint proof formed on substrate (7) after removal of cover sheet (1).
Figure 1F:
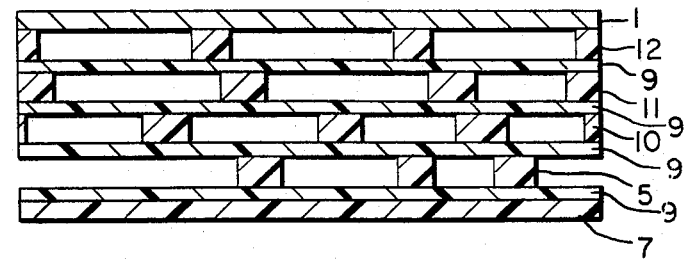
FIG. 1F illustrates a four color surprint proof formed on substrate (7) wherein three additional colored areas (10), (11) and (12), prepared from separate photosensitive elements as shown in FIG. 1A, are laminated successively by means of separate adhesive layers (9) over first colored areas (5), e.g., yellow. The three additional colored areas (10), (11) and (12), for example, are magenta, cyan and black, respectively. Support (1) is shown in FIG. 1F over the upper colored areas (12) as a protective layer although other types of protective layers can be used.

In using the photosensitive elements of this invention to prepare surprint proofs the film elements are exposed to conventional halftone color separation transparencies by means of actinic radiation to which the photoadherent layer is most sensitive, e.g., a carbon arc which is rich in ultraviolet radiation. Other radiation sources which may be used include mercury vapor or pulsed xenon lamps and lasers. The exposed elements are then delaminated at room temperature by stripping with a moderate to rapid continuous motion the cover sheet (1) from the element at an angle of generally at least 135° forming two elements: (i) cover sheet bearing on its surface colored exposed image areas, and (ii) sheet support bearing the contiguous layer having on its surface complementary colored unexposed image areas. Element (i) or Element (ii) useful in the process of this invention is then adhered to the surface of a substrate ((7) in FIG. 1D wherein use of element (i) is illustrated). The substrate which is flat and preferably smooth can be aluminum, e.g., anodized and/or silicated, copper (scrubbed) which may be present or a printed circuit board, films, e.g., polyethylene terephthalate of photographic grade which may be subbed as described in Alles U.S. Pat. No. 2,779,684; adhesive subbed opaque polyethylene terephthalate film base, e.g., Melinex® 994, sold by I.C.I. Americas, Wilmington, DE, and paper stock, e.g., Kromekote® opaque white paper, Champion Paper Co., Stamford, Conn. The adhesion of element (i) of (ii) to the substrate which may be permanent can be accomplished in several ways. An adhesive composition which should have no harmful effect on any surface with which it comes in contact can be applied as a thin layer, e.g., 40 to 90 mg/dm$^2$, either to the colored image surface of element (i) or element (ii), to the above-described substrate, or to both surfaces. Suitable adhesives are polymeric coatings which include:

polyvinylacetate which is preferred, poly(methylmethacrylate/ethyl acrylate/acrylic acid). e.g., in weight ratios of 55/38/7, 37/55/8; poly(vinyl chloride/vinyl acetate/vinyl alcohol), e.g., in weight ratio 91/3/6; poly(vinyl chloride/vinyl acetate/maleic acid), e.g., in weight ratio 83/16/1;

poly(methylmethacrylate/n-butylmethacrylate/methacrylic acid), e.g., in weight ratio 69/30/1;

poly(ethylmethacrylate/methacrylic acid, e.g., in weight ratio 98.5/1.5; etc. It has been found expedient when applying the adhesive to the image surface, substrate or both to have the adhesive present on a suitable support ((8) in FIG. 1B) which has a lower degree of adhesion than the surface to which the adhesive is applied. The adhesive, for example, can be coated on a support film ((8) in FIG. 1B) coated with a release layer, e.g., a polyethylene terephthalate film coated with silicone-release layer, e.g., poly(dimethylsiloxane). For ease of handling, a removable film, e.g., polyethylene, polypropylene, etc., can be present on the side of the adhesive opposite the support film to protect the adhesive layer. After removing the removable film on the adhesive layer, the supported adhesive is laminated, e.g., at ambient temperature, to the intended surface, preferably the substrate for the surprint proof. The support film and release layer are then removed, e.g., by peeling, leaving the thin adhesive layer adhered to the surface ready to receive the colored image surface of the element (i) or element (ii). The element can be applied to the adhesive-bearing substrate by lamination, e.g., in a range of 120° to 140° C. at a speed of about 1.5 to 3.0 feet/minute (45.72 to 91.44 cm/minute). After cooling to ambient temperature the cover sheet of element (i) or the supported contiguous layer of element (ii) is removed by peeling, e.g., at ~180° and 20 to 200 inches/minute (50.8 to 508 cm/minute) leaving on the adhesive-bearing substrate the colored image, e.g., generally yellow, the multilayer element having been imagewise exposed through a similarly colored separation negative or positive.

After applying an adhesive layer as described above to the surface of either element (i) or element (ii) or the initial colored image on the substrate, a second element (i) or element (ii), e.g., magenta color, is applied in register and adhered to the first colored image. The same conditions as described above apply. A three- or four-color surprint proof is prepared by repeating the process one or two more times. The upper two colors generally are cyan and black. The multilayer elements prior to peeling apart are imagewise exposed through cyan or black separation negatives or positives in known manner. A preferred mode is illustrated in Example 1 below.

In another embodiment of the invention wherein the numbers are the same as found in FIG. 1, the relationship of the adhesion of the first colored areas (5) in element (i) or colored areas (6) in element (ii) to substrate (7) of the surprint proof may be modified so that substrate (7) is not permanently attached but is capable of being removed from adhesive layer (9), and the substrate-free surprint laminated to another substrate, e.g., any substrate to which it is receptive. The modification of the adhesion relationship includes alteration of the adhesive composition to make it less adherent to substrate (7) or modification of the surface of substrate (7) to permit ease in removal of substrate (7) from the surprint proof.

INDUSTRIAL APPLICABILITY

The process of this invention is useful in preparing colored surprint proofs by a dry method which involves peeling and laminating or adhering. After imagewise exposure through a color separation negative or positive and peeling apart of the described photosensitive multilayer element, two separate colored images are formed, one present on the cover sheet and the other on the sheet support. Either of these elements can be adhered to the surface of a substrate, and the cover sheet or sheet support, respectively, is removed. By repeating the process up to 3 times using photosensitive elements having different colors present in the photosensitive layer, the different colored images are adhered one on top of the other to form a 3- or 4-color surprint proof.

EXAMPLES

The following examples illustrate the invention wherein the parts and percentages are by weight. The molecular weight of the polymers are expressed as number average molecular weights ($\overline{Mn}$). The $\overline{Mn}$ for the polymers can be determined by gel permeation chromatography employing a polybutadiene standard or other polymer standard as is known to those skilled in the art.

Peel forces determined at high peel rates, e.g., 600 inches/minute to 9000 inches/minute (1524 cm/minute to 22,860 cm/minute) or more are measured as follows: a calibrated spring scale is attached by means of a clamp to one end of the support of a one-inch (2.54 cm) wide sample element. A film leader from a motor driven calibrated takeup roll is attached to the cover sheet of the sample element so as to remove the cover sheet at a peel angle of 180° from the surface of the element when the roll is activated. The peel force in g/inch (g/cm) is measured directly on the spring scale. Where a peel force value is given in the examples, peel force is determined with a sample which has been uniformly and fully exposed to the actinic radiation designated without the use of any phototool. Peel forces of unexposed samples are below 20 g/inch (~7.9 g/cm) and typically are between about 5 and 10 g/inch (~1.97 and ~3.94 g/cm).

EXAMPLE 1

A peel apart photosensitive elements having colored photoadherent layers are prepared as follows:

I. Colored Photoadherent Layer:

Photopolymerizable Coating Composition

For the photoadherent layer, a coating solution of a photopolymerizable composition was prepared by mixing together the following ingredients for each respective color:

| | Yellow | Magenta | Cyan | Black |
|---|---|---|---|---|
| Pigment[1] | 9.00 | 8.93 | 4.37 | 11.18 |
| Polymethylmethacrylate (inherent viscosity - 0.25 g polymer in 50 ml chloroform, 20° C. No. 50 Cannon-Fenske Viscometer is 1.38) | 39.38 | 37.17 | 44.80 | 38.89 |
| Polymethylmethacrylate/2-ethylhexyl acrylate (63/37) | 2.25 | 4.53 | 1.46 | 5.59 |
| Desmodur ® N $\overline{Mn}$ 9000 Methacrylated epoxy monomer(adduct of bis-phenol A, epichlorohydrin methacrylic acid) | 39.85 | 39.85 | 39.85 | 37.17 |
| (2-o-Chlorophenyl-4,5,diphenyl imidazolyl) dimer | 3.00 | 3.00 | 3.00 | 2.65 |
| 2-Mercaptobenzoxazole | 1.72 | 1.72 | 1.72 | 1.72 |
| 4,4'-Diethylamino benzophenone | 2.00 | 2.00 | 2.00 | 2.00 |
| Brightener[2] | 2.00 | 2.00 | 2.00 | 2.00 |
| Poly(ethylene oxide) Mn 300,000 | 0.70 | 0.70 | 0.70 | 0.70 |
| Fluorad ® FC 430, liquid nonionic surfactant, 3M Co. | 0.1 | 0.1 | 0.1 | 0.1 |

[1]Pigments
yellow: Cromophtal ® Yellow 3G, C.I. No. Pigment Yellow 93
magenta: Monastral ® Violet R, C.I. No. Pigment Violet 19
cyan: Monastral ® Blue G (BT 383D). C.I. No. Pigment Blue 15
black: Raven ® 450, C.I. No. Pigment Black 7

[2]2-(stilbyl-4")-(naphtho-1',2',4,5)-1,2,3-triazol-2"-sulfonic acid phenyl ester Samples of polyethylene terephthalate film having a thickness of 50 microns which had been surface treated by electrostatic discharge at 0.05 coulomb/ft$^2$ (0.544 coulomb/m$^2$) were coated with each of the above solutions (12% in methylene chloride) at a coating weight of ~40 mg/dm when dried.

II. Contiguous Layer

Tacky Elastomer Coating Composition

A coating solution was prepared by mixing together the following ingredients:

| | |
|---|---|
| Sytrene-isoprene block co-polymer (12/86) Brookfield viscosity - 20%, 77° F. toluene - 1600 cps | 99.5% |
| Tetra-bis methylene 3-(3,5-ditert-butyl-4 hydroxyphenyl) propionate methane | 0.5% |

The solution was coated on a polyethylene terephthalate support having a thickness of 75 microns to give a coating weight of ~100 mg/dm$^2$ when dried.

Yellow, magenta, cyan and black photosensitive elements were exposed through half-tone separation negatives by means of a 5 KW high pressure mercury vapor lamp (Violux ®5002S sold by Exposure Systems Company, Bridgeport, Conn) for 40 seconds at 54 inches (137.16 cm) from the lamp and then stripped apart (rate ~3500 inches/minute at an angle of about 180° C.) to form two separate elements from each color:
  (i) a positive, exposed colored image on the electrostatic discharge treated polyester cover sheet, and
  (ii) a complementary, unexposed colored image on the support bearing the tacky contiguous layer.

The peel force of a test sample is about 400 g/inch (157.48 g/cm). Separate yellow element (i) was laminated at 260° F. (127° C.), 2 feet/minute (0.61/minute) to a white opaque polyester surprint receptor stock bearing a thin layer of polyvinylacetate 15 cps. 20° C. Ostwald-Fenske tubes coated at ~50 mg/dm². The adhesive used was coated on silicone-release polyethylene terephthalate and covered with polyethylene. Applying the adhesive layer involved laminating the adhesive-coated film at 107° C. and removing the silicone-release polyethylene terephthalate (and polyethylene) to reveal the adhesive surface. After cooling to room temperature, the electrostatic discharge treated cover sheet was peeled at 180° and a rate of about 200 inches/minute (508 cm/minute) leaving behind the exposed yellow image on the adhesive. Another adhesive-coated film was laminated over the yellow image at ~225° F. (107° C.) and ~3 feet/minute (0.91 m/minute) and the magneta element (i) aligned over the image in register. The package was again laminated at 260° (127° C.) and 2 feet/minute (0.61 m/minute) together and after cooling the cover sheet removed as previously described to leave behind a transferred exposed magenta image. The same process was used for the cyan and black (i) elements, inner-laminated with an adhesive layer, to sequentially build up a 4-color surprint proof from the overlay (i) elements by transfer of the exposed colored image to the adhesive layer.

EXAMPLE 2

Example 1 was repeated except that the adhesive layer used on the silicone-release polyethylene terephthalate support was methylmethacrylate/ethyl acrylate/acrylic acid (55/38/7, $\overline{M}n$ 42,000, manufactured by B. F. Goodrich, Akron, Ohio). The coating weight was about 55 mg/dm² (dried) on the silicone-release polyethylene terephthalate support sheet; a polyethylene cover sheet was employed.

EXAMPLE 3

Example 1 was repeated except that the adhesive layer used on the silicone-release polyethylene terephthalate support was methylmethacrylate/ethyl acrylate/acrylic acid (37/55/8, $\overline{M}n$ 260,000, manufactured by B. F. Goodrich, Akron, Ohio). The adhesive coating weight was about 55 mg/dm² (dried) on the silicone-release polyethylene terephthalate support sheet; a polyethylene cover sheet was employed.

EXAMPLE 4

Example 1 was repeated except that the adhesive layer used on the silicone-release polyethylene terephthalate support was vinyl chloride/vinyl acetate/vinyl alcohol (91/3/6, $\overline{M}n$ 23,200, manufactured by Union Carbide, New York, N.Y.). The adhesive coating weight was about 70 mg/dm² (dried) on the silicone-release polyethylene terephthalate support sheet; a polyethylene cover sheet was employed.

EXAMPLE 5

Example 1 was repeated except that the adhesive layer used on the silicone-release polyethylene terephthalate support was vinyl chloride/vinyl acetate/maleic acid (83/16/1, 300 cps Brookfield viscosity at 25° C., manufactured by Union Carbide, New York, N.Y.). The adhesive coating weight was about 70 mg/dm² (dried) on the silicone-release polyethylene terephthalate support sheet; a polyethylene cover sheet was employed.

EXAMPLE 6

Example 1 was repeated except that the adhesive layer used on the silicone-release polyethylene terephthalate support was methyl methacrylate/n-butylmethacrylate/methacrylic acid (69/30/1, intrinsic viscosity 0.20, manufactured by E. du Pont de Nemours and Company, Wilmington, DE). The adhesive coating weight of about 70 mg/dm² (dried) on the silicone release polyethylene terephthalate support sheet; a polyethylene cover sheet was employed.

EXAMPLE 7

Example 1 was repeated except that the adhesive layer used on the silicone-release polyethylene terephthalate support was ethylmethacrylate/methacrylic acid (98.5/1.5, intrinsic viscosity 0.20, manufactured by E. I. du Pont de Nemours and Company, Wilmington, DE). The adhesive coating weight of about 70 mg/dm² (dried) on the silicone release polyethylene terephthalate support sheet and polyethylene cover sheet was employed.

EXAMPLE 8

Example 1 was repeated except that the opaque white polyethylene terephthalate surprint stock was replaced by an epoxy copper laminate (mechanically scrubbed). The adhesive used for image transfer was the same as that used in Example 3.

EXAMPLE 9

Example 1 was repeated except that the opaque white polyethylene terephthalate surprint stock was replaced by an anodized aluminum plate (silicated). The adhesive used for image transfer was the same as that used in Example 3.

EXAMPLE 10

Example 1 was repeated except that the opaque white polyethylene terephthalate surprint stock was replaced by a transparent Cronar ® polyester photographic film base (P-42), E. I. du Pont de Nemours and Company, Wilmington, DE. The adhesive used for image transfer was the same as that used in Example 3.

EXAMPLE 11

Example 1 was repeated except that the opaque white polyethylene terephthalate surprint stock was replaced by opaque white paper support Kromekote ®, sold by Champion Paper Co., Stamford, Conn. The adhesive used for image transfer was the same as that used in Example 3.

EXAMPLE 12

A polyvinylacetate adhesive-coated silicone-release polyethylene terephthalate film was described in Example 1 was laminated at 250° F. (122° C.) and 2 feet/minute (~0.61 m/minute) to each of the image surfaces of four elements (i) prepared as described in Example 1. The adhesive-bearing elements (i) were then laminated in the order set forth in Example 1 using a white opaque polyethylene terephthalate surprint receptor stock as the initial surface. The electrostatic discharge treated polyethylene terephthalate cover sheet of each element (i) was peeled off at 180° C. and a rate of about 200 inches/minute (508 cm/minute). While a satisfactory surprint proof was obtained, the proof was not of the quality of the proof obtained when the adhesive layer is present on the receptor stock.

EXAMPLE 13

Yellow, magenta, cyan and black photosensitive elements prepared as described in Example 1 were exposed through halftone separation positives and stripped apart as described in Example 1 to form two separate elements from each color:

(i) a complementary, exposed colored image on the electrostatic discharge treated polyethylene terephthalate cover sheet, and.
(ii) a positive, unexposed colored image on the polyethylene terephthalate support bearing the tacky, contiguous layer.

The four elements (ii) were surface treated with white opaque toner particles, Cromalin®TW6 Toner, E. I. du Pont de Nemours and Company, Wilmington, DE to remove the tackiness. The yellow element (ii) was laminated at 260° F. (127° C.) and 2 feet/minute (0.61 m/minute) to a white opaque polyethylene terephthalate surprint receptor stock bearing a thin layer of polyvinylacetate adhesive (15 cps at 20° C. Ostwald-Fenske tube) coated at about 90 mg/dm$^2$. The adhesive layer was applied by lamination as described in Example 1. After cooling to room temperature, the polyethylene terephthalate support bearing the nontacky contiguous layer with colored image was peeled at 180° and 400 to 500 inches/minute (1016 to 1270 cm/minute) leaving behind a transferred colored image on the surprint stock. Another layer of adhesive was laminated over the yellow image at 225° C. and about 3 feet/minute (0.91 m/minute) and the magenta element (ii) aligned over the yellow image in register. The magenta element (ii) was laminated to the yellow image at 260° C. and 2 feet/minute (0.61 m/minute). The polyethylene terephthalate support of the magenta element (ii), after cooling, was peeled as described above leaving behind a transferred magenta image. In similar manner the cyan and black elements (ii) were laminated to form a four color proof.

EXAMPLE 14

A polyvinylacetate adhesive-coated silicone-release polyethylene terephthalate film as described in Example 1 was laminated at 250° F. (122° C.) and 2 feet/minute (about 0.61 m/minute) to each of the nontacky image surfaces of four elements (ii) prepared as described in Example 13. The adhesive-bearing elements (ii) were then laminated in the order set forth in Example 13 using a white opaque polyethylene terephthalate surprint receptor stock as the initial surface. The polyethylene terephthalate support of each element (ii) was peeled off at ambient temperature and a rate of about 20 to 200 inches/minute (about 50.8 to 508 cm/minute). While a satisfactory surprint proof was obtained, the proof was not of the quality of the proof obtained when the the adhesive layer is present on the receptor stock.

I claim:

1. A process for preparing a surprint proof which comprises
    (a) exposing through an image bearing transparency a peel-apart photosensitive element comprising in order from top to bottom, (1) a strippable cover sheet comprised of a polymeric film which is transparent to actinic radiation, (2) a photoadherent layer containing a colorant and comprising a photohardenable material with ethylenically unsaturated or benzophenone type groups, (3) a nonphotosensitive organic contiguous layer, and (4) a sheet support, wherein, after exposure to actinic radiation, the peel force required to remove the cover sheet (1) with the exposed photoadherent layer (2) thereon from the contiguous layer (3) is at least four times the peel force required to remove the cover sheet (1) from an unexposed photoadherent layer (2);
    (b) peeling apart the exposed photosensitive element to form two elements: (i) cover sheet bearing on its surface colored exposed image areas, and (ii) sheet support bearing the contiguous layer having on its surface complementary colored unexposed image areas;
    (c) adhering one of said elements (i) or (ii) to the surface of a substrate, the degree of adhesion to the photoadherent layer being greater than the adhesion of the photoadherent layer to the contiguous layer or the cover sheet,
    (d) separating either the cover sheet of element (i), or the sheet support and contiguous layer of element (ii);
    (e) repeating steps (a) to (c) at least once using a new peel-apart photosensitive element which is adhered to said preceding element by a layer of adhesive.

2. A process according to claim 1 wherein each peel-apart photosensitive element is exposed through a different color separation transparency and the respective photoadherent layers are colored in a spectral region corresponding to the color separation transparency used for the exposure.

3. A process according to claim 2 wherein the colored photoadherent layers and color separation transparencies correspond, respectively, to yellow, magenta, cyan and black.

4. A process according to claim 1 wherein after initial step (d) steps (a) to (d) are repeated two times then steps (a) to (c) are repeated one time.

5. A process according to claim 1 wherein in step (a) the peel apart element is exposed through a negative transparency; in step (c) element (i) is adhered to the surface of the substrate; and in step (d) the cover sheet of element (i) is separated.

6. A process according to claim 1 wherein in step (a) the peel apart element is exposed through a positive transparency; in step (c) element (ii) is adhered to the surface of the substrate; and in step (d) the sheet support and contiguous layer are separated.

7. A process according to claim 1 wherein element (i) or element (ii) is adhered to the substrate surface by lamination, the substrate surface bearing a layer of adhesive.

8. A process according to claim 1 wherein element (i) or element (ii) is adhered to the substrate surface by lamination, the colored image areas of element (i) or element (ii) bearing a layer of adhesive.

9. A process according to claim 1 wherein the substrate is white opaque polyethylene terephthalate.

10. A process according to claim 1 wherein element (i) or element (ii) is adhered to the surface of the substrate by a polyvinylacetate adhesive.

11. A process according to claim 1 wherein the adhesive layer is applied to either the surface of element (i) or element (ii) or the surface of the substrate by laminating to said surface an adhesive-coated release-treated film and removing solely the release-treated film.

12. Process for preparing a surprint proof which comprises:

exposing through a color separation negative a peel-apart photosensitive element comprising in order from top to bottom, (1) a strippable cover sheet comprised of a polymeric film which is transparent to actinic radiation, (2) a photoadherent layer containing a colorant and comprising a photohardenable material with ethylenically unsaturated or benzophenone type groups, (3) a nonphotosensitive organic contiguous layer, and (4) a sheet support, wherein, after exposure to actinic radiation, the peel force required to remove the cover sheet (1) with the exposed photoadherent layer (2) thereon from the contiguous layer (3) is at least four times the peel force required to remove the the cover sheet (1) from an unexposed photoadherent layer (2);

(b) peeling apart the exposed photosensitive element to form two elements: (i) cover sheet bearing on its surface colored exposed image areas, and (ii) sheet support bearing the contiguous layer having on its surface complementary colored unexposed image areas;

(c) adhering the positive colored image of element (i) to the surface of a substrate, the degree of adhesion to the photoadherent layer being greater than the adhesion of the photoadherent layer to the cover sheet;

(d) separating the cover sheet of element (i);

(e) repeating steps (a) to (d) twice and then steps (a) to (c) once using new peel-apart photosensitive elements which, respectively, are exposed through different color separation negatives and the respective photoadherent layers of said elements are colored in a spectral region corresponding to the color separation negative used for the exposure, each exposed and peeled element (i) being adhered to a preceding colored image.

13. Process for preparing a surprint proof which comprises:

(a) exposing through a cover separation positive a peel-apart photosensitive element comprising in order from top to bottom, (1) a strippable cover sheet comprised of a polymeric film which is transparent to actinic radiation, (2) a photoadherent layer containing a colorant and comprising a photohardenable material with ethylenically unsaturated or benzophenone type groups, (3) a nonphotosensitive organic contiguous layer, and (4) a sheet support, wherein, after exposure to actinic radiation, the peel force required to remove the cover sheet (1) with the exposed photoadherent layer (2) thereon from the contiguous layer (3) is at least four times the peel force required to remove the cover sheet (1) from an unexposed photoadherent layer (2);

(b) peeling apart the exposed photosensitive element to form two elements: (i) cover sheet bearing on its surface colored exposed image areas, and (ii) sheet support bearing the contiguous layer having on its surface complementary colored unexposed image areas;

(c) treating the tacky image surface of element (ii) with transparent particles to remove the tackiness;

(d) adhering the positive image of element (ii) to the surface of a substrate, the degree of adhesion to the photoadherent layer being greater than the adhesion of the photoadherent layer to the contiguous layer;

(e) separating the support and contiguous layer of element (ii);

(f) repeating steps (a) to (e) twice and then steps (a) to (d) once using new peel-apart photosensitive elements which, respectively, are exposed through different color separation positives and the respective photoadherent layers of said elements are colored in a spectral region corresponding to the color separation positive used for the exposure, each exposed and peeled element (ii) being adhered to a preceding colored image.

14. A process according to claim 1 wherein in step (c) the adhesion of one of said elements (i) or (ii) to the surface to the substrate is permanent.

15. A process according to claim 1 wherein after step (e) the substrate is removed and the substrate-free surprint is laminated to another substrate.

* * * * *